(12) United States Patent
Tan et al.

(10) Patent No.: US 12,055,449 B2
(45) Date of Patent: Aug. 6, 2024

(54) FLEXIBLE SENSOR

(71) Applicant: Board of Trustees of Michigan State University, East Lansing, MI (US)

(72) Inventors: Xiaobo Tan, Okemos, MI (US); Mohammed Khalid Al-Rubaiai, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 715 days.

(21) Appl. No.: 17/005,384

(22) Filed: Aug. 28, 2020

(65) Prior Publication Data

US 2022/0066441 A1    Mar. 3, 2022

(51) Int. Cl.
| | | |
|---|---|---|
| *G01L 1/18* | (2006.01) | |
| *G01L 1/20* | (2006.01) | |
| *G05D 1/00* | (2006.01) | |
| *G05D 15/01* | (2006.01) | |
| *G06F 3/01* | (2006.01) | |

(52) U.S. Cl.
CPC .............. *G01L 1/18* (2013.01); *G01L 1/205* (2013.01); *G05D 1/0016* (2013.01); *G05D 15/01* (2013.01); *G06F 3/011* (2013.01)

(58) Field of Classification Search
CPC ........ G05D 1/0016; G05D 15/01; G01L 1/18; G06F 3/011
See application file for complete search history.

(56) References Cited

U.S. PATENT DOCUMENTS

| | | | | |
|---|---|---|---|---|
| 6,155,120 | A  * | 12/2000 | Taylor | A61B 5/1036 73/862.046 |
| 7,594,442 | B2 * | 9/2009 | Kaiserman | G01L 1/20 73/763 |
| 7,982,375 | B2 * | 7/2011 | Tan | H01L 41/042 310/330 |
| 8,161,826 | B1 * | 4/2012 | Taylor | A47C 27/082 73/862.041 |
| 10,835,180 | B2 * | 11/2020 | Dervish | A61B 5/6804 |
| 2014/0090488 | A1 * | 4/2014 | Taylor | G01L 1/18 73/862.625 |
| 2014/0366650 | A1 * | 12/2014 | Thillainadarajah | G01L 1/26 73/862.625 |
| 2017/0303853 | A1 * | 10/2017 | McMillen | A61B 5/6843 |

(Continued)

OTHER PUBLICATIONS

Al-Rubaiai, M., et al., "A 3-D Printed Stretchable Strain Sensor for Wind Sensing", Smart Materials and Structures 28 (Jun. 21, 2019).

(Continued)

*Primary Examiner* — Joan T Goodbody
(74) *Attorney, Agent, or Firm* — Harness, Dickey & Pierce, PLC (57) ABSTRACT

A flexible sensor is provided. A further aspect employs a sensor apparatus including pressure or force sensing layers or sheets in addition to location sensing layers or sheets. In another aspect, an electrical sensing circuit and flexible films are used to sense pressure and/or location of a contacting object. In another aspect, a compressible polymer includes conductive particles therein such that the compressible polymer changes electrical resistance when compressed to indicate a force or location. Still another aspect has stacked sandwiches of pressure and/or location sensing films, layers or sheets.

23 Claims, 8 Drawing Sheets

(56) References Cited

U.S. PATENT DOCUMENTS

2018/0114931 A1* 4/2018 Tian .......................... G01L 1/18
2021/0025772 A1* 1/2021 Rogers .................... G01L 1/205

OTHER PUBLICATIONS

Harris, L., "Thesis: Design and Fabrication of a Piezoresistive Tactile Sensor for Ergonomic Analyses" (Jan. 2014).

Kalantari, M., et al., "A New Approach for Modeling Piezoresistive Force Sensors Based on Semi-Conductive Polymer Composites", IEEE, vol. 17, issue 3, pp. 572-581 (Jun. 2012).

Matute, A., et al. "A Novel and Inexpensive Approach for Force Sensing Based on FSR Piezocapacitance Aimed at Hysteresis Error Reduction," Hindawi Journal of Sensors, vol. 2018, Article ID 6561901 (2018).

Mohamed, Z., "Development of a New Mobile Humanoid Robot for Assisting Elderly People," SciVerse Scient Direct Procedia Engineering 41 (2012) 345-351.

Park, Y-L., "Design Fabrication of Soft Artificial Skin Using Embedded Microchannels and Liquid Conductors," IEEE-Sensors Journal, vol. 12, No. 8 (Aug. 2012).

Shih, B., et al., "Electronic Skins and Machine Learning for Intelligent Soft Robots," Science Robotics: Review, vol. 5 (Apr. 22, 2020).

Shi, H., et al., "Screen-Printed Soft Capacitive Sensors for Spatial Mapping of Both Positive and Negative Pressures," Advanced Functional Materials, vol. 29, p. 1809116 (Apr. 5, 2019).

Spectra Symbol, "Datasheet: Membrane Potentiometer" (Jun. 1, 2007).

Suprapto, S., et al., "Low-Cost Pressure Sensor Matrix Using Velostat," 2017 5th International Conference on Instrumentation, Communications, Information Technology and Biomedical Engineering (ICICI-BME), Bandung, IEEE, p. 137 (Nov. 6-7, 2017).

Wikipedia article, "Force-Sensing Resistor" (Jul. 21, 2020).

Zhu, M., et al., "Haptic-Feedback Smart Glove as a Creative Human-Machine Interface (HMI) for Virtual/Augmented Reality Applications," Science Advances: Research Article, vol. 6 (May 8, 2020).

* cited by examiner

FIG - 16

FLEXIBLE SENSOR

BACKGROUND AND SUMMARY

The present application generally pertains to a sensor and more particularly to a flexible position and pressure sensor apparatus.

"Soft robotics technologies" have been investigated for human-machine interactions ("HMI") such as to assist elderly people or otherwise physically contact humans. Care must be taken to prevent collisions of the often rigid robotic components with humans to reduce injury. Deformable elastomers for stretchable sensors and compliant actuators have been attempted, as have use of soft or inflatable exterior surfaces on the robotic components. These prior approaches, however, lack the capability to directly sense external contacts through their body structures.

Pressure-mapping soft sensors have also been explored in HMI robots. Typically, numerous arrays of pressure points and transducers are built into the robotic system to provide a large number of discrete pressures measurements at selected locations. Such a system is mechanically complex, computationally intensive, expensive due to the large quantity of sensors, and relatively heavy.

Optoelectronic sensing has recently emerged as another soft sensor where bending is measured through changes in light that is emitted and received in a light guide. For example, fiber optic intensity modulation and fiber Bragg gratings based sensors have been experimentally tried. But this technique is problematic since it can only measure the total light loss along the entire sensor, requiring it to be uniformly curved which is impractical. Also, the fiber Bragg grating systems are highly sensitive to strain conditions which causes undesirable compensation complexity.

It is also known to make piezoelectric sensors including Polyvinylidene Fluoride (PVDF) films and an ionic polymer-metal composite (IPMC) film. See, for example, U.S. Pat. No. 7,982,375 entitled "Integrated Actuator Sensor Structure" which was issued on Jul. 19, 2011 to common inventor Xiaobo Tan et al., and is incorporated by reference herein. While this prior film sensor is a significant improvement in the industry for measuring a single value, additional improvements are desired.

In accordance with the present invention, a flexible sensor is provided. A further aspect employs a sensor apparatus including pressure or force sensing layers or sheets in addition to location sensing layers or sheets. In another aspect, an electrical sensing circuit and flexible films are used to sense pressure and/or location of a contacting object. In another aspect, a compressible polymer includes conductive particles therein such that the compressible polymer changes electrical resistance when compressed to indicate a force or location. Still another aspect has stacked sandwiches of pressure and/or location sensing films, layers or sheets. In yet an additional aspect, a thin and flexible pressure and/or location sensing apparatus is located on an exterior skin or surface of a robotic component, an aircraft component, an inflatable and curved component, a wearable garment, or the like. Methods of making and using a flexible pressure and/or location sensing sandwich are also provided.

The present sensor is advantageous over conventional devices. For example, it is thin, flexible and lightweight. Furthermore, the present apparatus can sense both a magnitude of pressure and a location of the pressure. The electrical circuitry and materials are less complex to make and use than conventional devices. The present sensor apparatus uses durable materials that are ideally suited for mounting on three-dimensionally and/or nonuniformly curved surfaces. Moreover, the present sensor apparatus beneficially covers a larger area than prior constructions such that fewer such sensors are needed which reduces expense and circuit complexity. Additional advantageous and features of the present system and method will become apparent from the following description and appended claims, taken in conjunction with the accompanying drawings.

DETAILED DESCRIPTION

Figure 1:
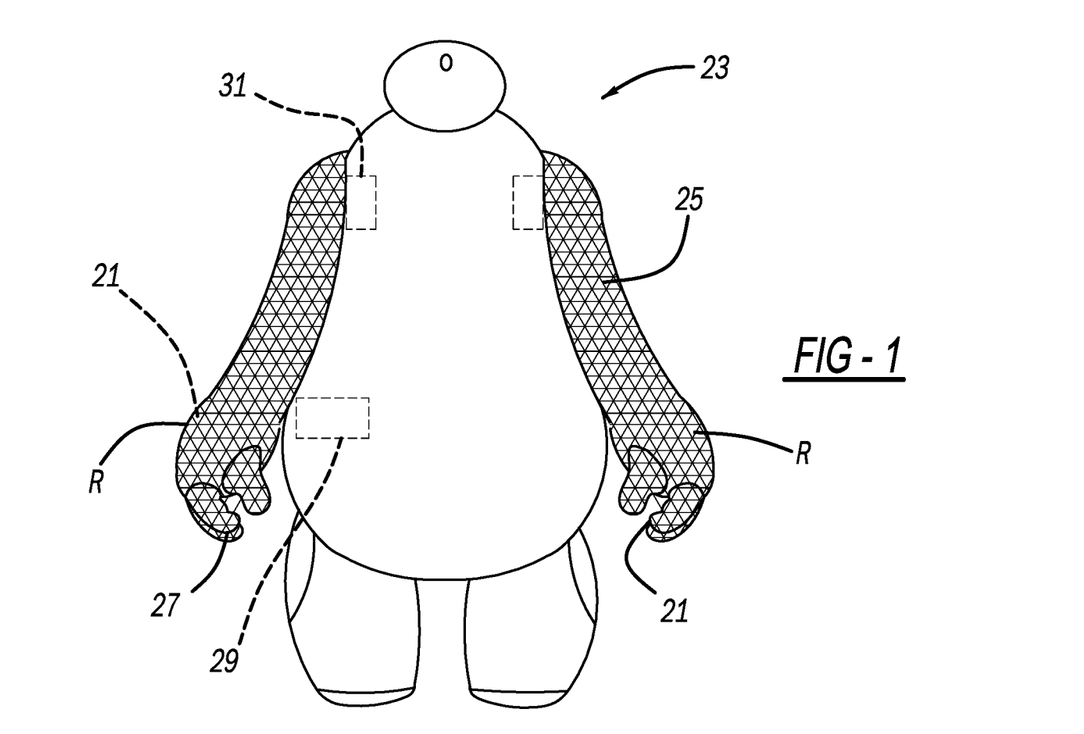
FIG. 1 is a front elevation view showing the present sensor employed on a robot.

A sensor 21 uses flexible conductive, insulating and force-sensing resistive sheets or films, which are stacked together into a thin sandwich to simultaneously sense or measure pressure magnitude as well as the location of the pressure. FIG. 1 shows sensors 21 attached to human contactable, exterior surfaces of a healthcare or industrial robot apparatus 23, for example, on movable arms 25 and gripping fingers 27. A software programmed, controller 29, including memory and a microprocessor, is connected to sensors 21 and automatically changes an energization state of actuators 31 coupled to the moving arms and fingers based on output signals from the sensors. Such actuators are electric motors, solenoids or fluid powered pistons. In the present exemplary soft robotic system, the sensors are in direct contact with the exterior surface of the robot and more flexible than the exterior surface so that deformation is transferred to the measuring sensor. The flexibility of sensor 21 is ideally suited for attachment to a curved and flexible surface of a human-contactable portion of a robot.

Figure 2:
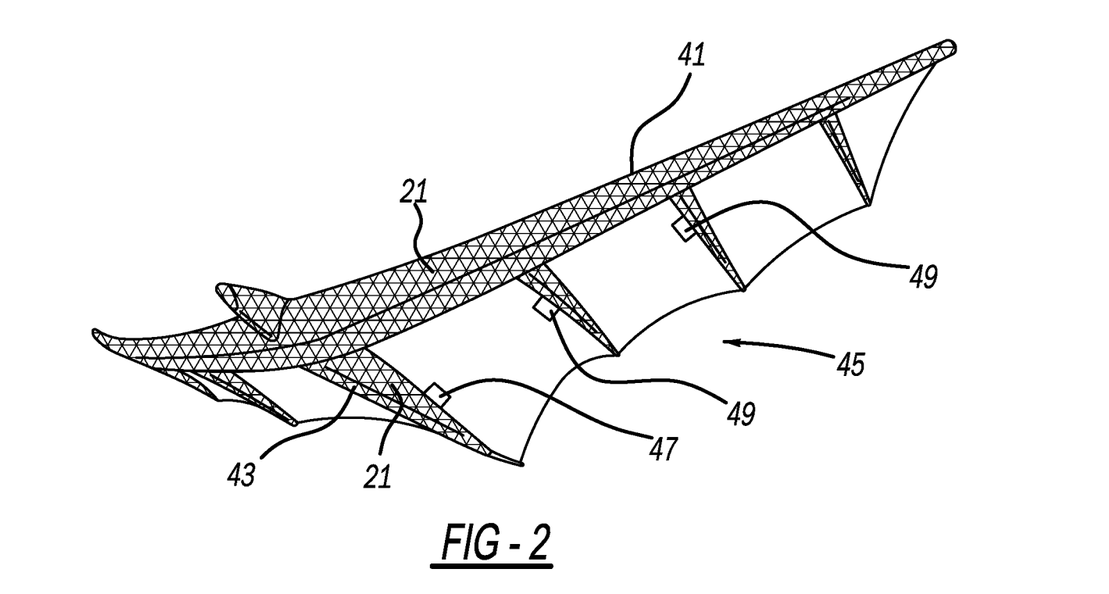
FIG. 2 is a perspective view showing the present sensor employed on a solar balloon or kite aircraft.

FIG. 2 illustrates sensors 21 placed on exterior surfaces, such as wings 41 and a fuselage body 43, of an aircraft apparatus 45. Exemplary aircraft apparatus 45 may be an inflatable kite, balloon, unmanned drones, or manned airplanes. A programmable controller 47 automatically causes actuators 49 to vary a shape, position or other characteristic of a wing, flap or propulsion device based on airflow pressure or deformation magnitude and position sensed by the sensors. The flexibility and large coverage area of sensor 21 is beneficial for attachment to a curved and large aircraft surface.

Figure 3:
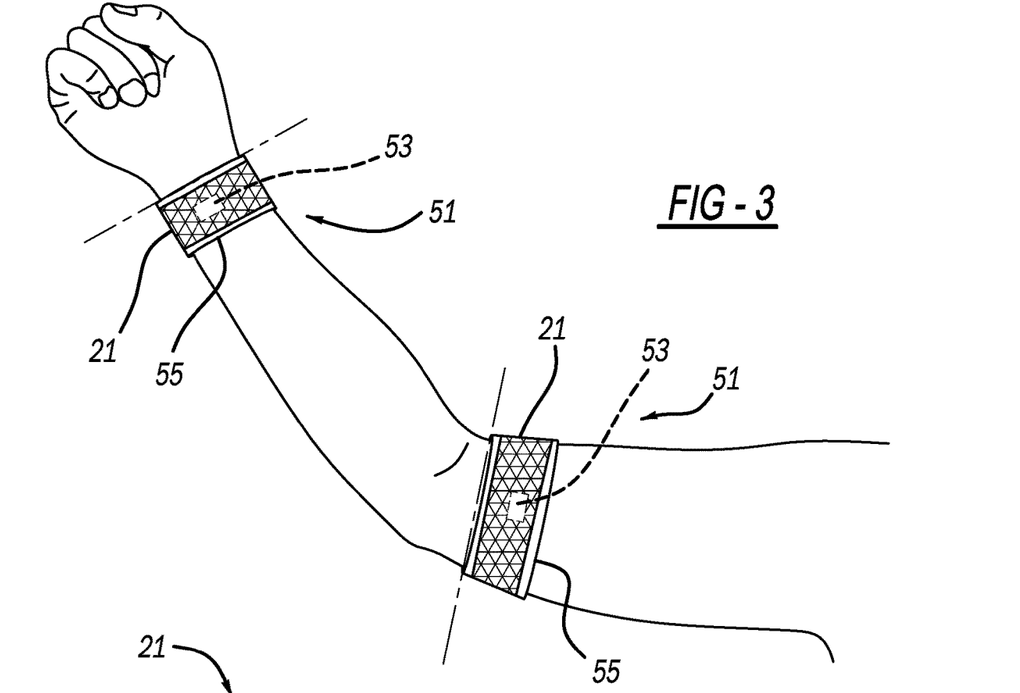
FIG. 3 is a perspective view showing the present sensor employed on a human-wearable garment.

A wearable apparatus 51 includes sensor 21 coupled to a programmable controller 53, both of which are attached to a garment 55. Garment 53 is shown as a flexible and stretchable, textile wristband and armband, but may alternately be headwear, footwear, a shirt, glove or pants. Sensor 21 may be mounted on an interior surface of garment 55 if intended to monitor a body function, or mounted on an exterior surface if used to sense contact with an external object such as another person or ball such as for use in a virtual reality video game or the like. Controller 53 includes memory, a microprocessor and a wireless communications device to a stationary, remote central control unit such as a virtual reality microprocessor to which multiples of the controller may be remotely coupled. The flexibility of sensor 21 is well suited for attachment to a curved and flexible garment.

Reference should now be made to FIGS. 4-12 for a more detailed description of sensor 21. Sensor 21 is a combination of a position or location sensor sandwich 61, and a flexible pressure or force sensor sandwich 63. All of the layers of both the position and pressure sensor portions 61 and 63, respectively, are parallel sheets or films of flexible material that are stacked upon each other and adhesively bonded or otherwise attached together. Accordingly, position sensor sandwich 61 is preferably mounted external to pressure sensor sandwich 63 such that the bottom sheet (in the illustrated orientation of FIGS. 4 and 5) of the pressure sensor sandwich is directly attached to the outer surface of the robot, aircraft or garment.

Figure 4:
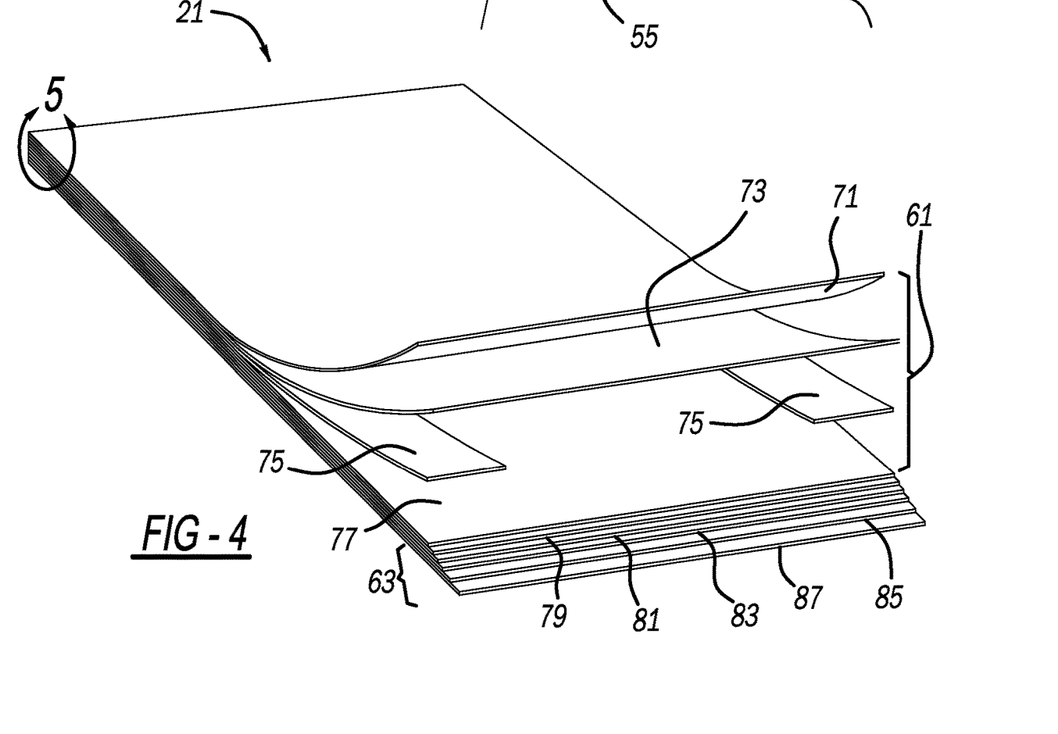
FIG. 4 is a partially peeled back, perspective view showing layers of the present sensor.
Figure 5:
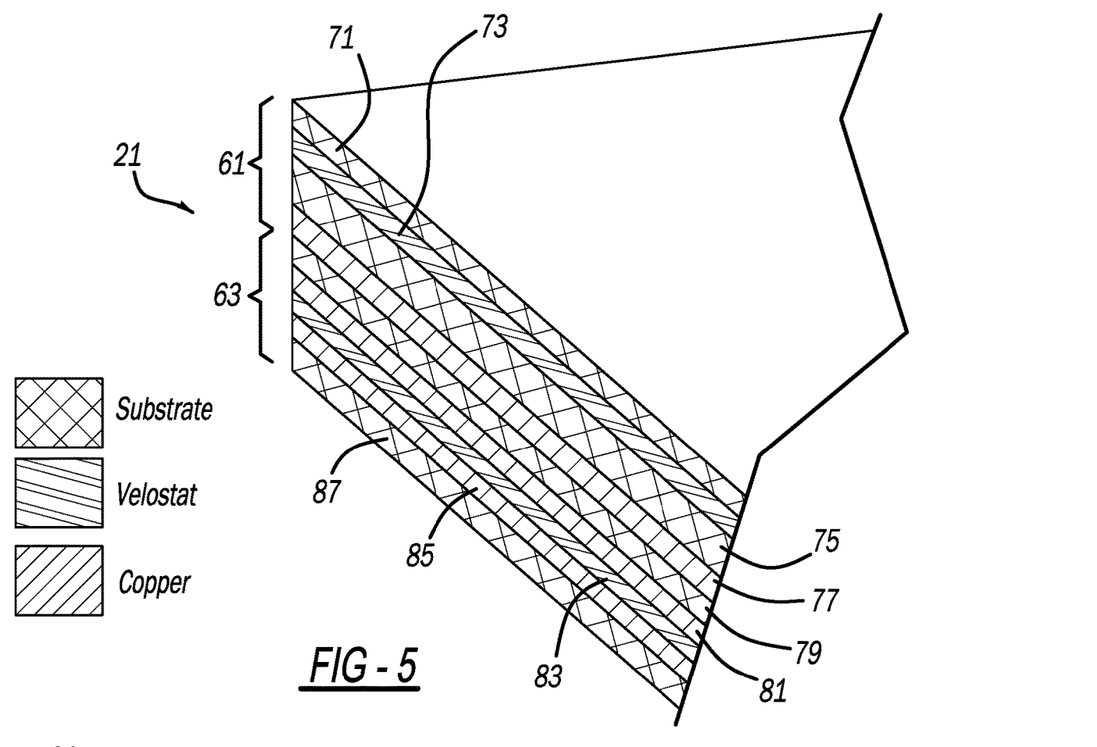
FIG. 5 is a fragmentary and enlarged perspective view, taken within circle 5 of FIG. 4, showing the layers of the present sensor.
Figure 6:
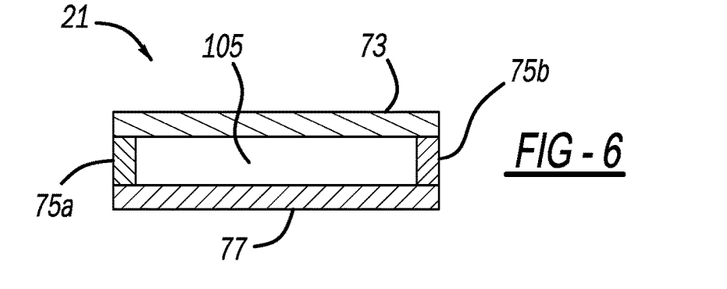
FIG. 6 is a front, cross-sectional view showing a sandwich of sensing layers of the present sensor.
Figure 7:
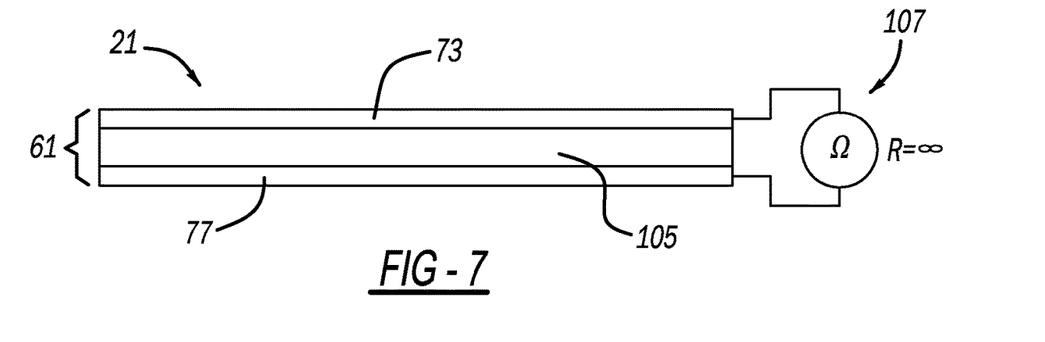
FIGS. 7-9 are a series of diagrammatic side views showing the sandwich of sensing layers of the present sensor in different operating conditions.
Figure 8:
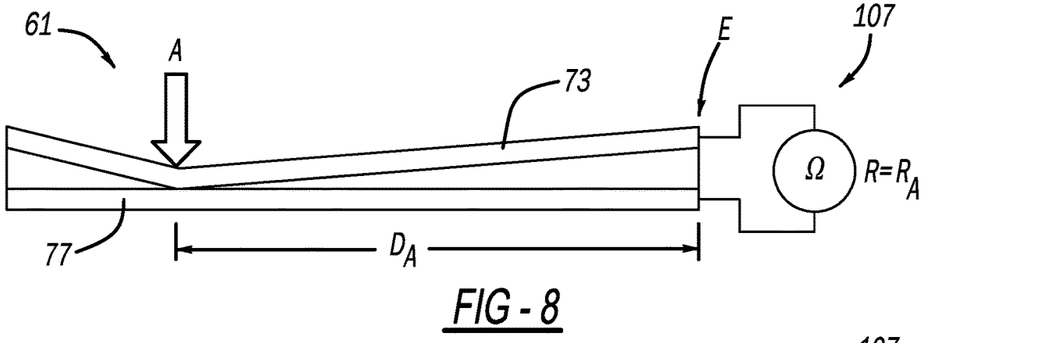

Position sensor sandwich 61 includes an outermost protective and insulating substrate sheet 71, a compressible polymeric sheet 73, one or more flexible and insulating spacer sheets 75, a conductive metallic sheet 77 and another insulating substrate sheet 79. Pressure sensor sandwich 63 shares insulating substrate sheet 79 and further includes a conductive metallic sheet 81, a compressible polymeric sheet 83, another conductive metallic sheet 85 and an innermost insulating substrate sheet 87. Conductive sheets 77, 81 and 85 are preferably copper or an alloy thereof.

Compressible polymeric sheets 73 and 83 are preferably a Velostat® material which is a compressible polymer 91 with conductive carbon particles 93 impregnated and encapsulated therein; they have piezo-resistive properties and act as a force-sensing resistor whose electrical resistance decreases when a force, pressure or mechanical stress is applied. As layer 81 is externally compressed toward layer 85 such as by a human finger or object pushing against substrate 71, particles 93 are moved closer together within the compressible polymer 91 such that electricity can more easily flow between layers 81 and 85, which can be observed by comparing FIGS. 10 and 11.

Figure 12:
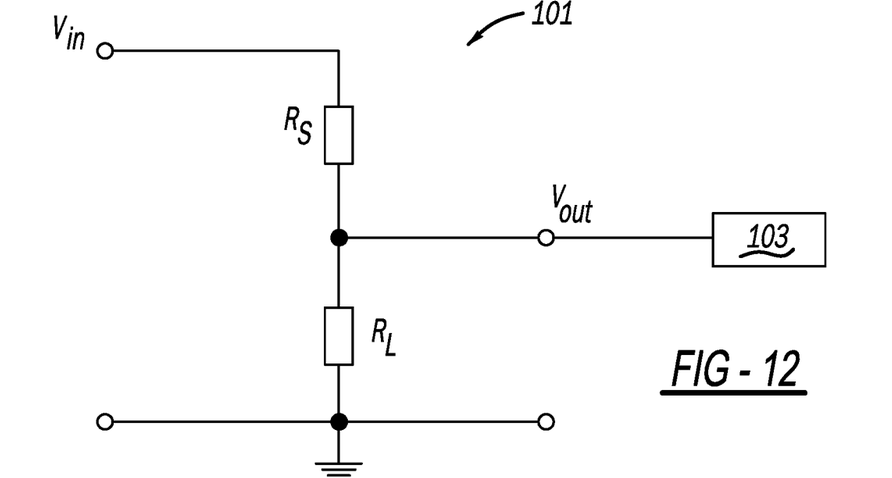
FIG. 12 is an electrical circuit diagram of the present sensor.

Conductive copper sheets 77, 81 and 85 each have an extension serving as a soldered electrical connection with a wire or printed trace of an external measurement circuit 101 (see FIG. 12). Compressible polymer layers 91 are peripherally larger than the adjacent layers of conductive copper sheets 77, 81 and 85, in order to avoid a short circuit between the conductors. The resultant sandwich structure is wrapped with non-conductive adhesive tape or other insulating materials. It is noteworthy that compressible polymer 91 of pressure magnitude sensor 63 may alternately be a layer of piezo-resistive foil sandwiched between two layers of conductive copper sheets 81 and 85.

Pressure-mapping sensor 61 acts as a variable resistor according to the position at which deformation occurs. It can, therefore, be used in a voltage divider configuration for circuit 101 of FIG. 12 in order to be read by a data acquisition device, such as a programmable computer controller 103; $V_{in}$ is direct current, $R_L$ is a resistor of a known resistive value and $R_S$ is the resistive value of sensor 63.

FIGS. 4 and 6-9 show the position sensor sandwich 61 in various sensing conditions. An internal air gap or space 105 of position sensor 61 is bounded by compressive polymer and conductive sheets 73 and 77 on the top and bottom, respectively, and on the sides by flexible and spaced apart sections 75a and 75b of insulator sheet 75. Position sensor 61 senses or detects linear position of the contact pressure or force applied through a point contact where compressive polymeric sheet 73 is bent into gap 105 to touch metallic conductive sheet 77, thereby allowing electrical current to pass therebetween. As can be observed by comparing the nominal state of FIG. 7, with the pressed location A, and with the pressed location B, a distance $D_A$ is greater than $D_B$ between the pressure point and the edge point E. This $D_A$ versus $D_B$ distance differential causes the electrical current to travel further from $D_A$ to a contact reference position E adjacent an edge of position sensor 61, as compared to the electrical current travel distance from $D_B$ to reference position E; the greater distance causes more opposition and thus, resistance to the current flow. In other words, the resistance value $R_A$ of exemplary $D_A$ is greater than the resistance value $R_B$ associated with distance $D_B$, which is detected and calculated as a position or location by a circuit 101 and processor 103 connected thereto.

Figure 13A:
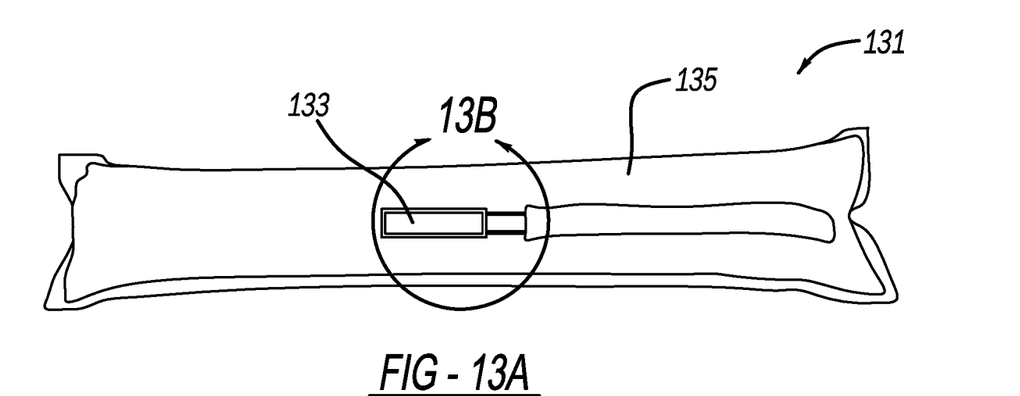
FIG. 13A is a perspective view showing the present sensor on an inflatable component.
Figure 13B:
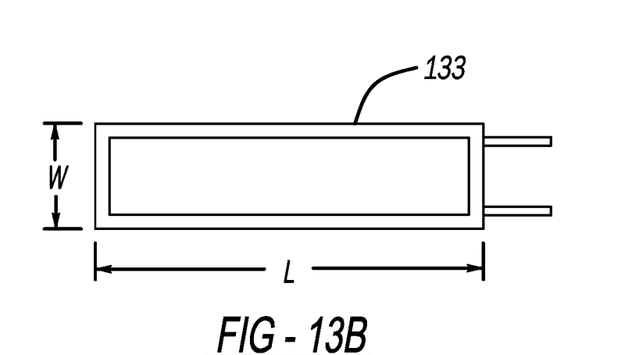
FIG. 13B is an enlarged, top elevation view showing a portion of the present sensor, within circle 13B of FIG. 13A.
Figure 14:
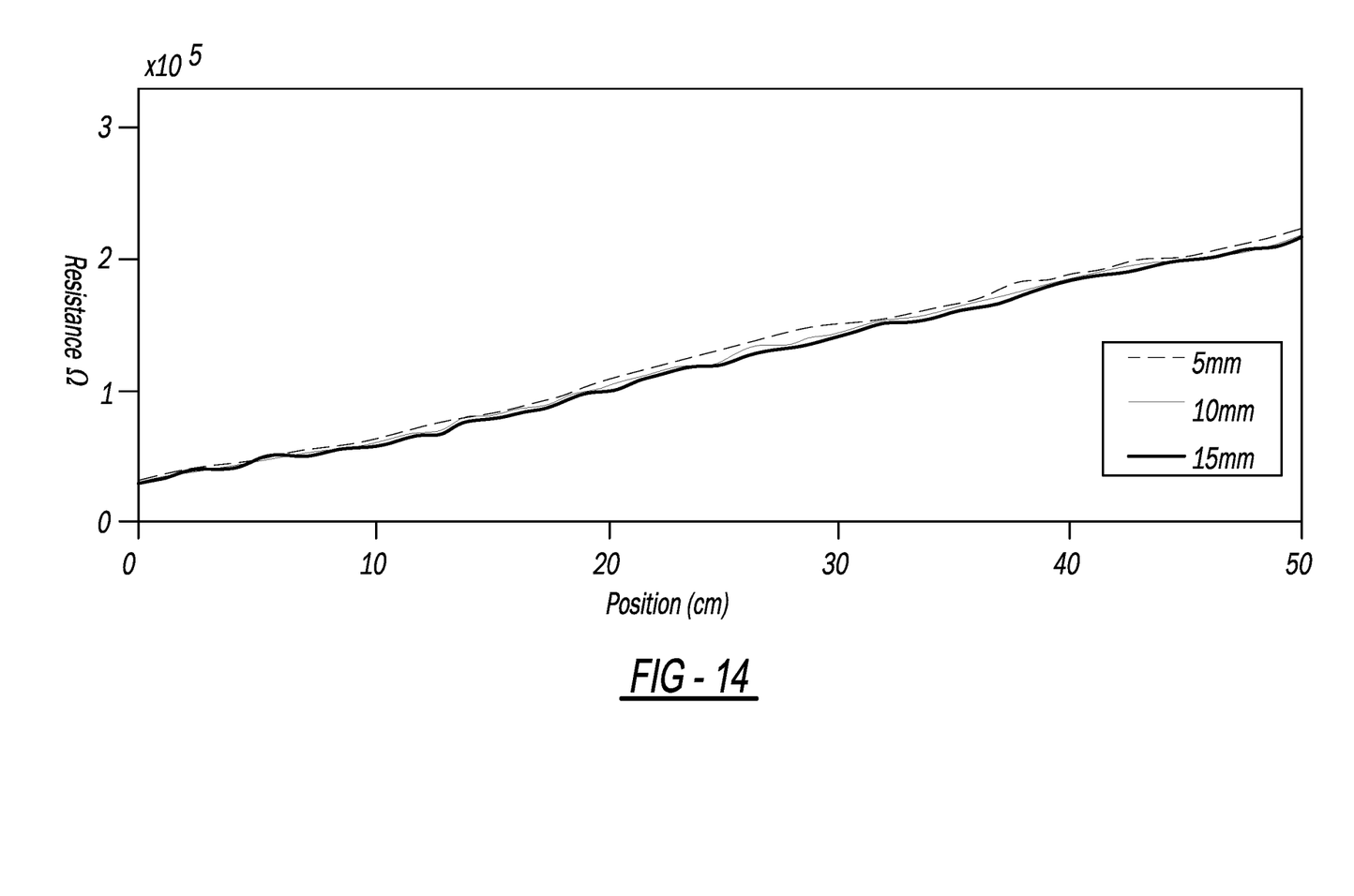
FIGS. 14 and 15 are graphs showing expected electrical performance of the present sensor.
Figure 15:
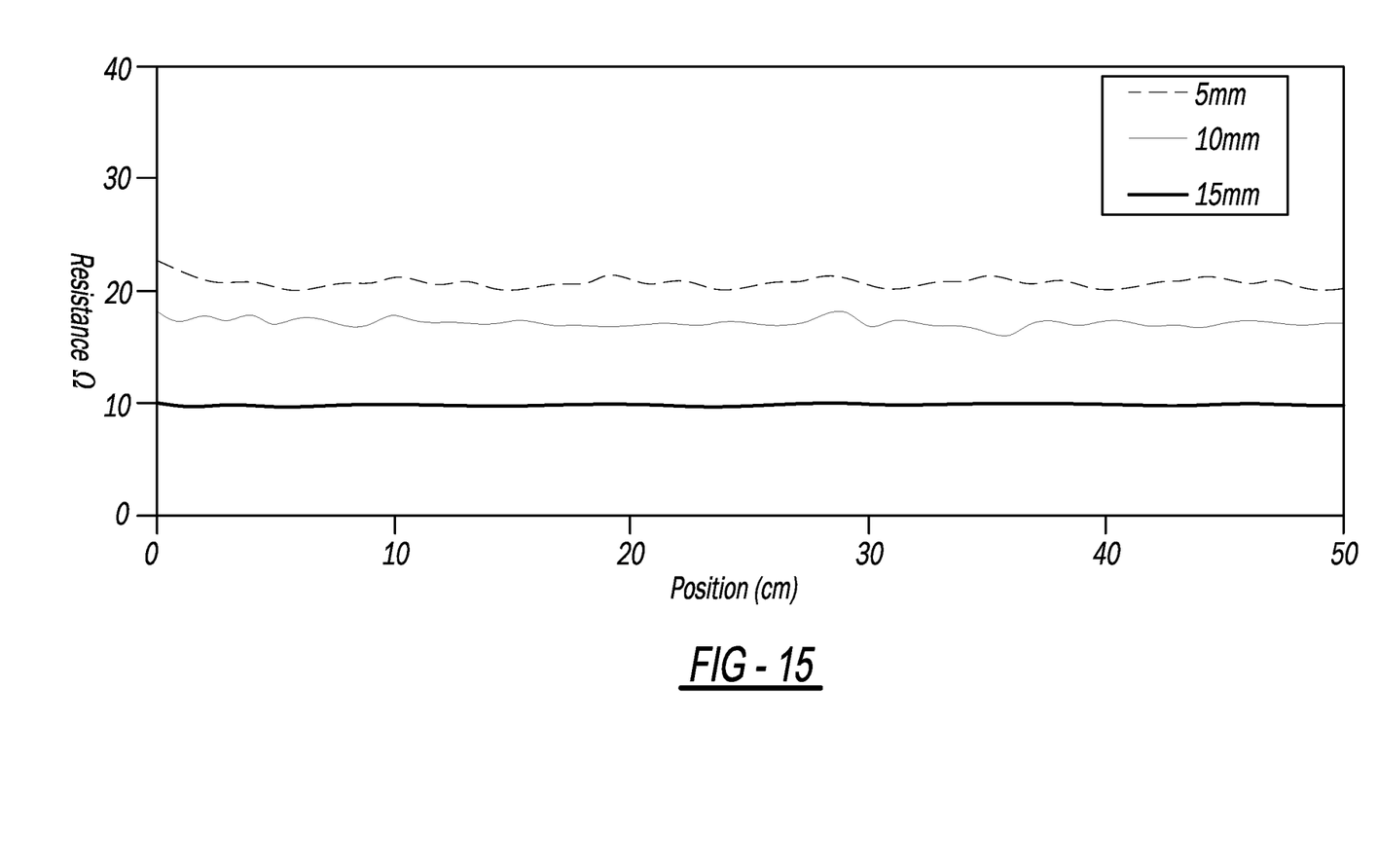

FIGS. 13A and 13B show another application of the present sensor apparatus 131 which includes a flexible, stacked sandwich of position and pressure sandwich layers 133 as discussed hereinabove. This is applied to a flexible and inflatable tube 135, such as an inflatable antenna, made with 420D Nylon fabric. In one exemplary configuration, the compressible polymeric layers contain a volume fraction of carbon particles of 0.2873 and a 500 nm diameter of the carbon particles. Advantageously, sensor sandwich 133 can sense both location and magnitude anywhere within at least a 25 mm$^2$ area and more preferably at least a 100 mm$^2$ area, thereby doing the work within a single position or single pressure sensor that would traditionally require an array of many laterally spaced apart sensors. Nevertheless, the present sensors may perform satisfactorily in a smaller size. Moreover, a total sensor sandwich thickness for both position and pressure layers, is preferably between 0.1 and 2.5 mm, and more preferably 0.5-1.0 mm. In this specific nonlimiting example, a peripheral dimension of the fabricated sensor system is 35 mm wide W, 500 mm long L, and a total thickness of 0.7 mm. FIG. 14 shows expected results from the pressure position sensor sandwich, indicating a linear relationship with the location of deformation applied, while the pressure magnitude output illustrated in FIG. 15 demonstrates a consistent resistance value for each deformation location. These graphs show expected results of deformation points at 5, 10, and 15 mm from the reference position, applied on the tube every 10 mm along the tube throughout the full sensor length of 500 mm. Combining the output from both sensors within the controller provides simultaneous position and magnitude values of the deformation along a large and curved area.

Figure 16:
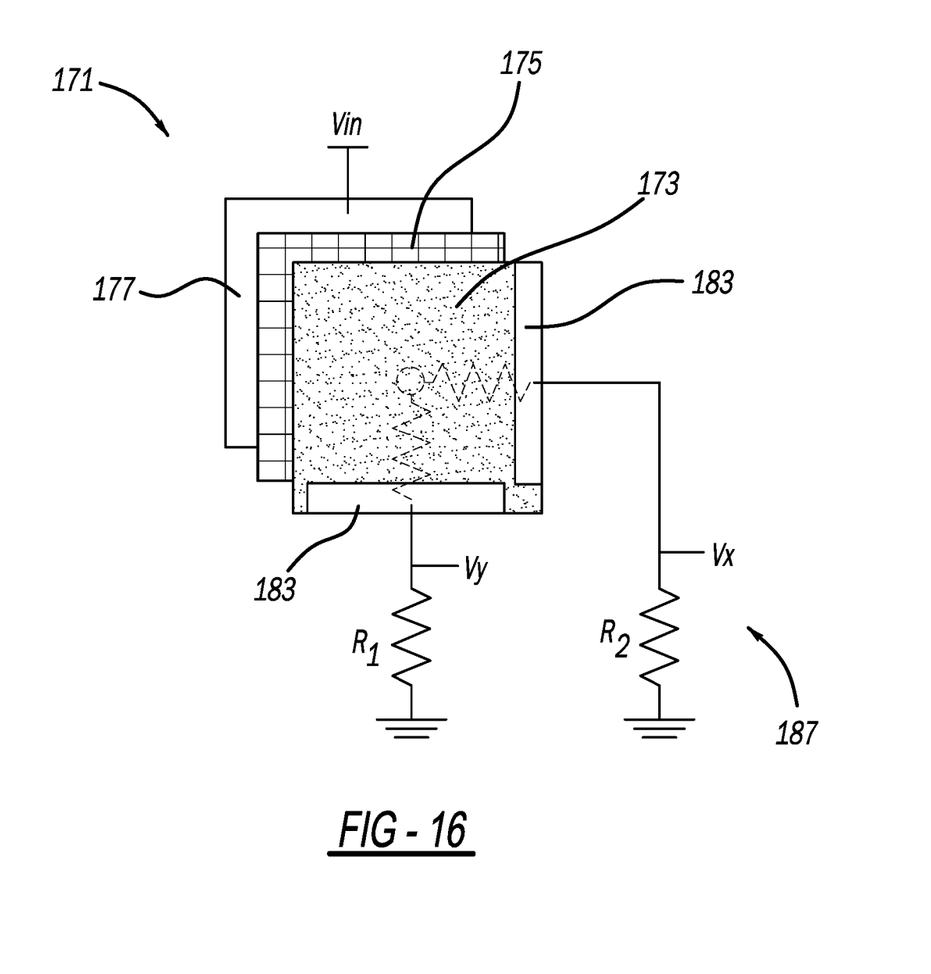
FIG. 16 is an exploded perspective view of an alternate embodiment of the present sensor.

Finally, reference should be made to FIG. 16. An alternate embodiment employs a two-dimensional position sensor sandwich 171 which may optionally be stacked on top of a pressure magnitude sensor sandwich such as that previously described hereinabove. This sensor apparatus 171 includes a compressible polymeric Velostat® film or sheet 173, an insulating polymeric mesh film or sheet 175, and a metallic (preferably copper) conductive film or sheet 177. Protective and insulating outer and inner substrate sheets (not shown) may also be employed.

The entire sensor apparatus is flexible, thin and covers a large lateral area. The compressible polymeric sheet 173 contains electrically conductive particles spaced apart within a compressible polymeric matrix material. Furthermore, the polymeric mesh sheet 175 contains an insulating web of intersecting walls with laterally open air gaps or spaces between adjacent walls to allow the compressible polymer sheet to push into the gaps to make electrical contact when a contact force is applied. This creates measurable resistance due to the electrical current travel lengths in generally perpendicular directions (shown with phantom oscillating lines) to indicate distances from the pressure point to the perpendicularly oriented edge contact strips 183.

Figure 9:
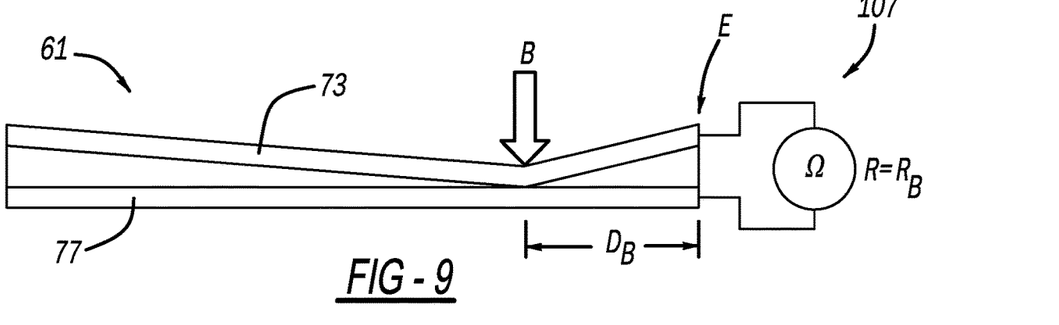
Figure 10:
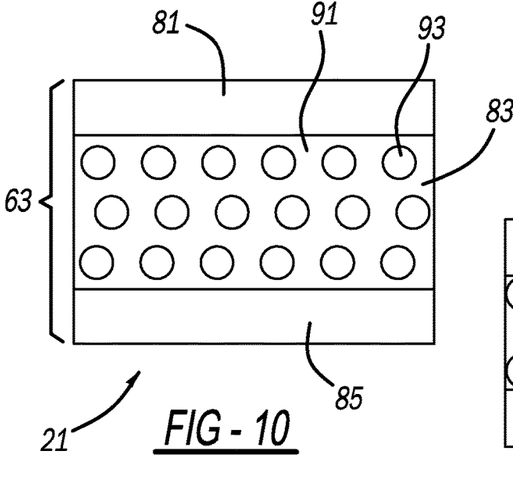
FIGS. 10 and 11 are enlarged diagrammatic side views showing the present sensor in different operating conditions.
Figure 11:
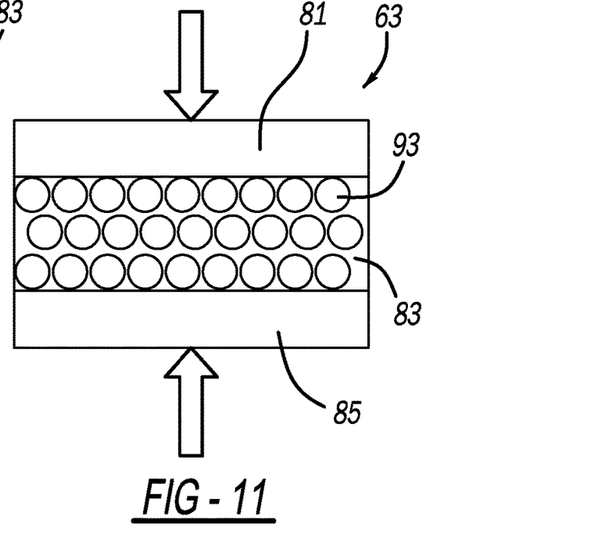

Elongated electrical connector edge contact strips 183 on sheet 173 are connected to their respective electrical circuits 187, and thus, the strips 183 define offset X and Y reference locations E (see FIG. 9). X and Y position electrical circuits 187 are connected to the connector edge contacts, thereby sensing contact location along two differently oriented linear axes for use by a programmable computer processor to automatically determine the two-dimensional position of the contract based at least in part, on the sensed $R_X$ and $R_Y$ measured signals.

While various features of the present invention have been disclosed, it should be appreciated that other variations may be employed. For example, different peripheral shapes and sizes can be employed, although various advantages of the present system may not be realized. As another example, additional or fewer sandwich layers may be used, but certain benefits may not be obtained. Additionally, alternate materials or one or more sheets may be provided, although performance may suffer. For example, the conductive particles may be carbon nanotubes, metallic (e.g., silver) nanowires, or any combination thereof, instead of or in addition to carbon nanoparticles. The present location sensor sandwich may be used independently of the present pressure sensor sandwich, and vice versa, however, many of the present synergistic advantages will not be achieved. Features of each of the embodiments and uses may be interchanged and replaced with similar features of other embodiments, and all of the claims may be multiply dependent on each other in any combination. Variations are not to be regarded as a departure from the present disclosure, and all such modifications are intended to be included within the scope and spirit of the present invention.

The invention claimed is:

1. A sensor apparatus comprising:
 (a) a location sensing sandwich portion comprising a compressible sensing layer and a conductive electrode film layer, between which is an insulating spacer layer;
 (b) a pressure sensing sandwich portion comprising a first film layer and a conductive electrode film layer, between which is a compressible layer;
 (c) one of the sensing sandwich portions being stacked on top of the other of the sensing sandwich portions such that the layers all lie in substantially parallel planes when in a nominal condition;
 (d) the compressible layers being electrically conductive to at least an associated one of the conductive electrode film layers when compressed;
 (e) a pressure electrical circuit connected to the pressure sensing sandwich portion operably determining a compressive pressure by an output from the pressure sensing sandwich portion, when the compressible layer of the pressure sensing sandwich portion is compressed;
 (f) a location electrical circuit connected to the location sensing sandwich portion operably determining a compressive location within the location sensing sandwich portion by an output from the location sensing sandwich portion, when the compressible layer of the location sensing sandwich portion is compressed; and
 (g) first and second electrical contacts oriented in offset elongated directions and attached adjacent to different peripheral edges of the compressible sheet of the location portion;
 (h) the location electrical circuit comprising an X location electrical circuit connected to the first electrical contact;
 (i) the location electrical circuit comprising a Y location electrical circuit connected to the second electrical contact;
 (j) a programmable processor connected to the X and Y circuits, the processor automatically determining the compression location in two-dimensions on the location portion; and
 (k) a software program stored in memory and run by the processor, the software program automatically changing an energization state of actuators based on output signals from the portions.

2. The sensor apparatus of claim 1, wherein each of the compressible layers comprises a polymeric material with conductive particles therein, and the conductive particles are moved closer together and conduct electricity when compressed.

3. The sensor apparatus of claim 2, wherein the conductive particles are carbon, nanotubes or metallic nanowires, with the polymeric material located between and separating the particles in the nominal condition.

4. The sensor apparatus of claim 1, wherein the first film layer of the pressure sensing sandwich portion is a conductive electrode.

5. The sensor apparatus of claim 1, wherein:
 the compressible layer of the pressure sandwich portion includes a piezo-resistive foil; and
 the first film layer and the conductive electrode film layer of the pressure sandwich portion each include metallic material to act as electrodes in contact on opposite surfaces of the compressible layer.

6. The sensor apparatus of claim 1, wherein the compressible layers have reduced electrical resistance therein when compressed and cause outputs indicative of: a magnitude of pressure for the pressure sensing sandwich portion, and a location distance within the location sensing sandwich portion from predetermining reference locations adjacent edges of the location sensing sandwich portion, to be sent through the pressure circuit and the location circuit, respectively.

7. The sensor apparatus of claim 1, wherein:
 the location sensing sandwich portion acts as a linear position sensor since the longer a length of the compressive layer that must be travelled by the electricity flowing therein;

the length is a distance between a predetermined reference location and a position of compression, and a resistance value is changed when the position of compression changes; and the location electrical circuit including a resistor of a predetermined value.

8. The sensor apparatus of claim 1, wherein:
the location and pressure sandwich portions have a sensing area of at least 25 mm$^2$;
all of the film layers have a total thickness of 0.1-2.5 mm; and
the film layers are flexible about X and Y axes.

9. The sensor apparatus of claim 1, wherein the location sensing sandwich portion includes an air gap between the compressible layer and the conductive electrode film layer when in the nominal condition, and the compressible layer moves into the gap and contacts the conductive electrode film layer when in a compressed condition.

10. The sensor apparatus of claim 1, further comprising each of the sensing sandwich portions having an active sensing dimension of at least 100 mm in at least one direction.

11. The sensor apparatus of claim 1, further comprising a robot including a surface upon which the sensing sandwich portions are attached, the circuits automatically causing a change in movement of the robot due to both of the outputs, and the sandwich portions being located on a human-contactable and movable arm or finger portion of the robot moved by the actuators.

12. The sensor apparatus of claim 1, further comprising an aircraft including a surface upon which the sensing sandwich portions are attached, the circuits automatically causing a change in movement of the aircraft due to both of the outputs, and the sandwich portions having an active sensing dimension of at least 100 mm in at least one direction.

13. The sensor apparatus of claim 1, further comprising a wearable wristband, armband, headwear or footwear garment coupled to a virtual reality controller, the sensing sandwich portions are attached to the garment, and the sandwich portions having an active sensing dimension of at least 100 mm in at least one direction.

14. A sensor apparatus comprising:
(a) a flexible location sensor comprising a substrate sheet and a metallic electrode sheet, between which is located a compressible sheet comprising spaced apart conductive particles encapsulated within a polymer;
(b) the location sensor being configured to sense contact location based on where the conductive particles are compressed toward each other which causes a change in electrical resistance;
(c) a flexible force sensor comprising metallic electrode sheets, between which is a compressible sheet comprising spaced apart conductive particles encapsulated within a polymer;
(d) the force sensor being configured to sense magnitude of a force where the conductive particles are compressed toward each other to conduct electricity between the adjacent electrodes of the force sensor;
(e) one of the sensors being stacked on top of the other of the sensors with an insulating sheet therebetween;
(f) the location sensor operably sensing linear position since electricity flowing a distance between a predetermined reference location and a position of compression changes a resistance value when the linear position of the compression changes;
(g) first and second electrical contacts oriented in offset elongated directions and attached adjacent to different peripheral edges of the compressible sheet of the location sensor;
(h) an X location electrical circuit connected to the first electrical contact;
(i) a Y location electrical circuit connected to the second electrical contact;
(j) a programmable processor connected to the X and Y circuits, the processor automatically determining a two-dimensional compression position on the location sensor; and
(k) a software program stored in memory and run by the processor, the software program automatically changing an energization state of actuators coupled to moving robotic arms or fingers based on output signals from the sensors.

15. The sensor apparatus of claim 14, wherein the conductive particles are carbon, nanotubes or metallic nanowires, with the polymeric material located between and separating the particles in a nominal condition; and each of the sensors have an active sensing dimension of at least 100 mm in at least one direction.

16. The sensor apparatus of claim 14, wherein:
the compressible sheet of the pressure sensor includes a piezo-resistive foil;
the location sensor is mounted external to the force sensor such that an innermost sheet of the force sensor is directly attached to an outer surface of a robot;
each of the sensors have an active sensing dimension of at least 100 mm in at least one direction; and
the location sensor includes the substrate sheet which is a flexible, outermost protective and insulating sheet.

17. The sensor apparatus of claim 14, wherein:
the sheets are all stacked on top of each other in parallel planes with a total thickness of the stacked sheets being no greater than 1.0 mm, and the compressible sheets have reduced electrical resistance therein when compressed and cause outputs indicative of: a magnitude of force for the force sensor, and a location distance from a predetermining reference location for the location sensor;
the location sensor is configured to acts as a linear position sensor since the longer a length of the compressive layer that must be travelled by electricity flowing therein;
the length is a distance between a predetermined reference location and a position of compression, and a resistance value is changed when the position of compression changes; and
the location electrical circuit includes a resistor of a predetermined value.

18. The sensor apparatus of claim 14, wherein the sheets are all stacked on top of each other in parallel planes, and the location sensor includes a hollow gap between the compressible sheet and the electrode sheet when in a nominal condition, and the compressible sheet moves into the gap and contacts the electrode sheet when in a compressed condition, and the location sensor is configured as a pressure-mapping variable resistor.

19. The sensor apparatus of claim 14, wherein the sandwich portions are located on a human-contactable portion of the finger of the robot, which is a movable gripping finger, and the actuators are electric motors.

20. A sensor apparatus comprising:
(a) a flexible position sensor comprising at least one electrode sheet adjacent which is located a compressible sheet comprising spaced apart conductive particles encapsulated within a polymer;

(b) the position sensor being configured to sense contact position based on where the conductive particles are compressed;

(c) a flexible pressure sensor comprising at least one electrode sheet adjacent which is a compressible sheet comprising spaced apart conductive particles encapsulated within a polymer;

(d) the pressure sensor being configured to sense a force where the conductive particles are compressed toward each other;

(e) the sheets are all stacked on top of each other in parallel planes; and (f) a component including a flexible and curved exterior surface upon which the sensors are attached, the component comprising at least one of:
  i. an aircraft wing or fuselage; or
  ii. an inflatable antenna; and (g) a programmable controller automatically causing actuators to vary a shape, position or characteristic of the curved exterior surface based on (i) airflow pressure, or (ii) deformation magnitude and position, sensed by the sensors;

(h) first and second electrical contacts oriented in offset elongated directions and attached to the compressible sheet of the position sensor;

(i) an X location electrical circuit connected to the first electrical contact;

(j) a Y location electrical circuit connected to the second electrical contact; and (k) the programmable controller being connected to the X and Y circuits, and the programmable controller automatically determining a two-dimensional compression position on the position sensor.

21. The sensor apparatus of claim 20, wherein:
a total thickness of the stacked sheets being no greater than 2.5 mm; and
the sensors having an active sensing dimension of at least 100 mm in at least one direction.

22. The sensor apparatus of claim 20, wherein the position sensor includes a hollow gap between the compressible sheet and the electrode sheet when in a nominal condition, and the compressible sheet moves into the gap and contacts the electrode sheet when in a compressed condition, and the position sensor is configured as a pressure-mapping variable resistor.

23. The sensor apparatus of claim 20, wherein the component is the aircraft wing or fuselage.

* * * * *